(12) United States Patent
Song et al.

(10) Patent No.: US 11,349,397 B2
(45) Date of Patent: *May 31, 2022

(54) METHOD AND APPARATUS FOR CONTROLLING A FLYBACK CONVERTER

(71) Applicant: Delta Electronics (Shanghai) Co., Ltd., Shanghai (CN)

(72) Inventors: Haibin Song, Shanghai (CN); Daofei Xu, Shanghai (CN); Jinfa Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 38 days.

This patent is subject to a terminal disclaimer.

(21) Appl. No.: 17/008,593

(22) Filed: Aug. 31, 2020

(65) Prior Publication Data

US 2020/0395863 A1  Dec. 17, 2020

Related U.S. Application Data

(63) Continuation-in-part of application No. 16/455,732, filed on Jun. 27, 2019, now Pat. No. 10,797,603.

(30) Foreign Application Priority Data

Jul. 3, 2018  (CN) .......................... 201810718910.1
Jun. 21, 2019  (CN) .......................... 201910544717.5

(51) Int. Cl.
*H02M 3/335* (2006.01)
*H02M 1/00* (2006.01)
*H02M 1/34* (2007.01)

(52) U.S. Cl.
CPC ...... *H02M 3/33507* (2013.01); *H02M 1/0025* (2021.05); *H02M 1/0058* (2021.05); *H02M 1/342* (2021.05); *H02M 1/348* (2021.05); *H02M 3/33592* (2013.01)

(58) Field of Classification Search
CPC ................. H02M 1/0058; H02M 1/38; H02M 1/34–348; H02M 3/335; H02M 3/33507; H02M 3/33523; H02M 3/33569; H02M 3/33592

See application file for complete search history.

(56) References Cited

U.S. PATENT DOCUMENTS

10,177,670 B1 *  1/2019  Lin ...................... H02M 1/083
10,797,603 B2 *  10/2020  Song ...................... H02M 1/38
(Continued)

*Primary Examiner* — Fred E Finch, III
(74) *Attorney, Agent, or Firm* — CKC & Partners Co., LLC (57) ABSTRACT

The present invention discloses a method and an apparatus for controlling a flyback converter, the flyback converter including a main switch, a transformer, and an auxiliary switch. The method includes: obtaining a first voltage signal and a second voltage signal, the first voltage signal representing an input voltage of the flyback converter, and the second voltage signal representing an output voltage of the flyback converter; controlling turn-on of the auxiliary switch, wherein the turn-on time period of the auxiliary switch is determined according to the first voltage signal and the second voltage signal; and turning on the main switch at ZVS condition, wherein the main switch is turned on at the time delayed for a duration of a dead time after turning off of the auxiliary switch.

31 Claims, 9 Drawing Sheets

(56) References Cited

U.S. PATENT DOCUMENTS

| | | | | |
|---|---|---|---|---|
| 2013/0063185 | A1* | 3/2013 | Ye | G01R 19/16547 |
| | | | | 363/21.07 |
| 2014/0233275 | A1* | 8/2014 | Yang | H02M 3/33576 |
| | | | | 363/21.17 |
| 2017/0264206 | A1* | 9/2017 | Rana | H02M 3/33569 |
| 2018/0226895 | A1* | 8/2018 | Song | H02M 1/34 |
| 2018/0287481 | A1* | 10/2018 | Liu | H02M 3/156 |
| 2018/0294731 | A1* | 10/2018 | Song | H02M 3/33523 |
| 2018/0294734 | A1* | 10/2018 | Song | H02M 1/083 |
| 2018/0301974 | A1* | 10/2018 | Lin | H02M 1/38 |
| 2018/0301975 | A1* | 10/2018 | Lin | H02M 3/33569 |
| 2019/0115845 | A1* | 4/2019 | Jitaru | H02M 1/08 |
| 2019/0149052 | A1* | 5/2019 | Gong | G01R 19/16547 |
| | | | | 363/21.07 |
| 2019/0229624 | A1* | 7/2019 | Liu | H02M 1/34 |

* cited by examiner

METHOD AND APPARATUS FOR CONTROLLING A FLYBACK CONVERTER

CROSS-REFERENCE TO RELATED APPLICATIONS

This application is a Continuation-in-part application of U.S. patent application Ser. No. 16/455,732, filed on Jun. 27, 2019, and entitled "Method And Apparatus For Controlling A Flyback Converter", the entire contents of which are incorporated herein by reference.

This non-provisional application claims priority under 35 U.S.C. § 119(a) on Patent Application No. 201810718910.1 filed in P. R. China on Jul. 3, 2018 and No. 201910544717.5 filed in P.R. China on Jun. 21, 2019, the entire contents of which are hereby incorporated by reference.

Some references, if any, which may include patents, patent applications, and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

BACKGROUND OF THE INVENTION

1. Field of the Invention

The present invention relates to a method and an apparatus for controlling a flyback converter, and specifically to a method and an apparatus for controlling a flyback converter suitable for applications with variable output voltages.

2. Related Art

A flyback converter is a preferred topology for adapters due to its simple circuit schematic. However, its switching frequency is limited by turn-on losses of the main switch in the flyback converter. A conventional method for reducing the turn-on losses of the main switch is to achieve zero-voltage-switching (ZVS) of the main switch. The ZVS may be achieved by turning on an auxiliary switch for a duration of time before the turn-on of the main switch. The auxiliary switch may be an active clamp switch, or a switch connected to an auxiliary winding in series or a synchronous rectifier switch.

In a conventional control scheme, a turn-on time of the auxiliary switch, and a dead time between the auxiliary switch and the main switch are both constant. However, such a control scheme is not suitable for applications with variable output voltages, which is the requirement of Universal Serial Bus Power Delivery (USB PD) in the future. Therefore, in order to optimize efficiency, the turn-on time of the auxiliary switch and the dead time are required to be variable in response to variations of an input voltage and an output voltage, thereby increasing the complexity of the controller. Moreover, with increasing switch frequency, the dead time becomes relatively smaller. Consequently, transmission delay and parameter tolerance of the controller become a huge obstacle for controlling variable dead time.

Therefore, there is a requirement for providing a method and an apparatus for controlling a flyback converter in order to solve the drawbacks of the conventional technologies.

SUMMARY OF THE INVENTION

In order to overcome the above-mentioned problems existing in the prior art, one aspect of the present disclosure is to provide a method for controlling a flyback converter, the flyback converter including a main switch, a transformer, and an auxiliary switch. The method comprises: obtaining a first voltage signal and a second voltage signal, wherein the first voltage signal relates to an input voltage of the flyback converter, and the second voltage signal relates to an output voltage of the flyback converter; controlling turn-on of the auxiliary switch, wherein a turn-on time period of the auxiliary switch is determined according to the first voltage signal and the second voltage signal, wherein the turn-on time period of the auxiliary switch increases when a voltage of the first voltage signal is increasing and wherein the turn-on time period of the auxiliary switch increases when a voltage of the second voltage signal is decreasing; and turning on the main switch at zero voltage switching condition, wherein the main switch is turned on at a time delayed for a duration of a dead time after turning off of the auxiliary switch.

Another aspect of the present disclosure is to provide an apparatus for controlling a flyback converter, the flyback converter including a main switch, a transformer, and an auxiliary switch. The apparatus comprises: a first operation means for controlling turn-on of the auxiliary switch, wherein a turn-on time period of the auxiliary switch is determined according to a first voltage signal and a second voltage signal, the first voltage signal representing an input voltage of the flyback converter, and the second voltage signal representing an output voltage of the flyback converter, wherein the turn-on time period of the auxiliary switch increases when a voltage of the first voltage signal is increasing and wherein the turn-on time period of the auxiliary switch increases when a voltage of the second voltage signal is decreasing; and a second operation means for turning on the main switch at zero voltage switching condition, wherein the main switch is turned on at a time delayed for a duration of a dead time after turning off of the auxiliary switch.

BRIEF DESCRIPTION OF THE DRAWINGS

FIG. 3b is a flow chart showing steps of the method in FIG. 3a.

DETAILED DESCRIPTION OF THE INVENTION

The present disclosure will be further described in detail with reference to the accompanying drawings and embodiments. Those embodiments are implemented according to the technical ideas of the present disclosure. Although specific configuration and processes are described in those embodiments, the protection extent of the present disclosure is not limited thereto.

Figure 1:
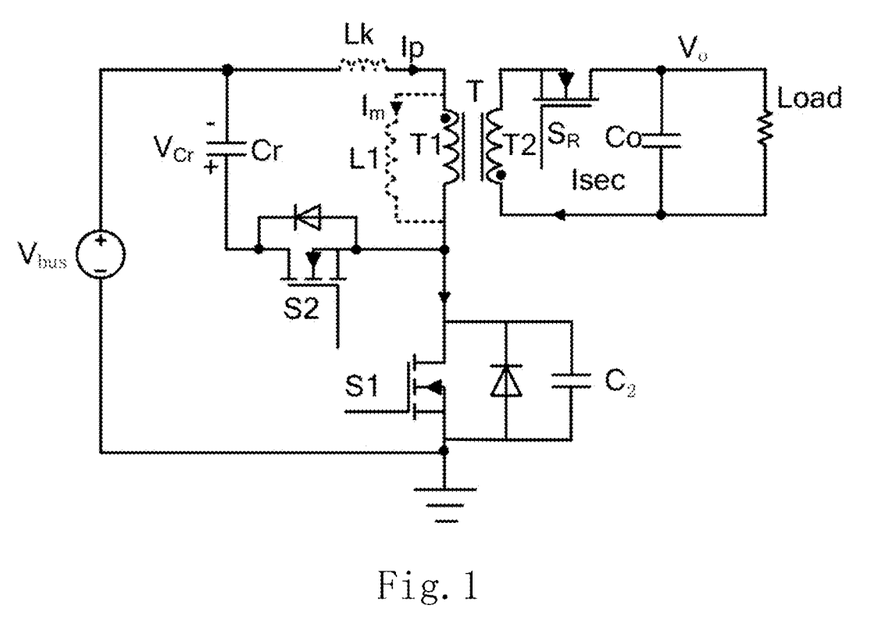
FIG. 1 is an explanatory diagram showing a circuit schematic of a flyback converter according to a first embodiment of the present disclosure.
Figure 2:
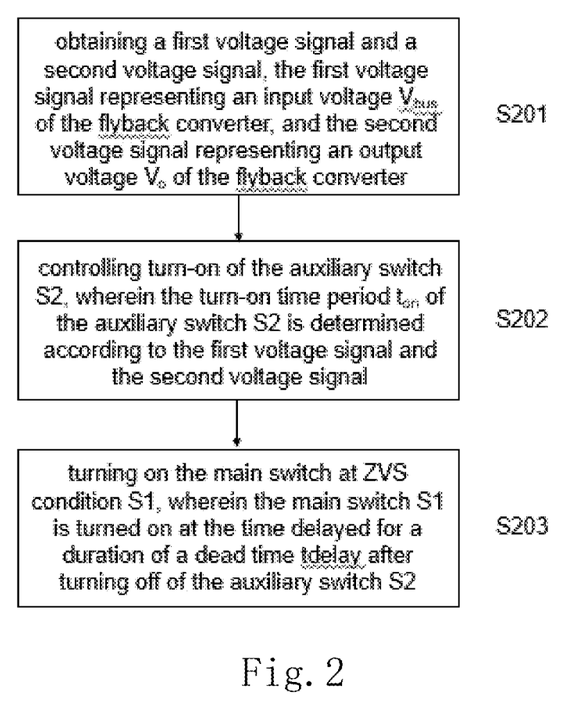
FIG. 2 is a flow chart showing a method for controlling the flyback converter according to an embodiment of the present disclosure.
Figure 3A:
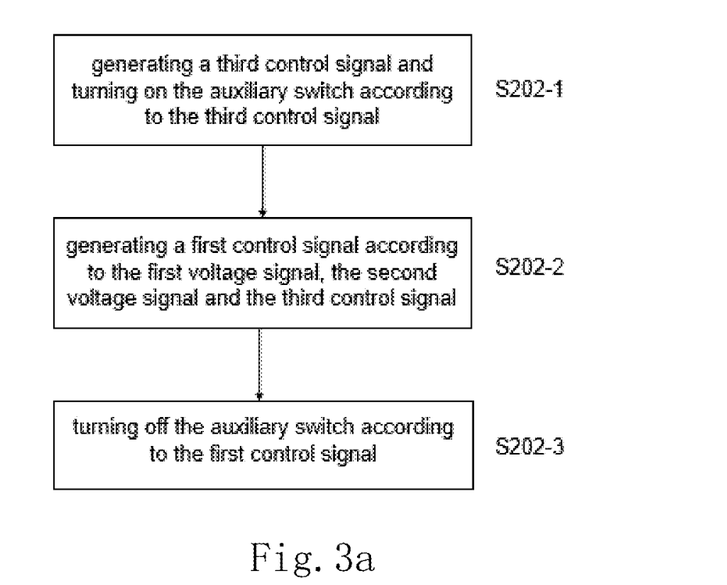
FIG. 3a is a flow chart showing steps of the method in FIG. 2.
Figure 3B:
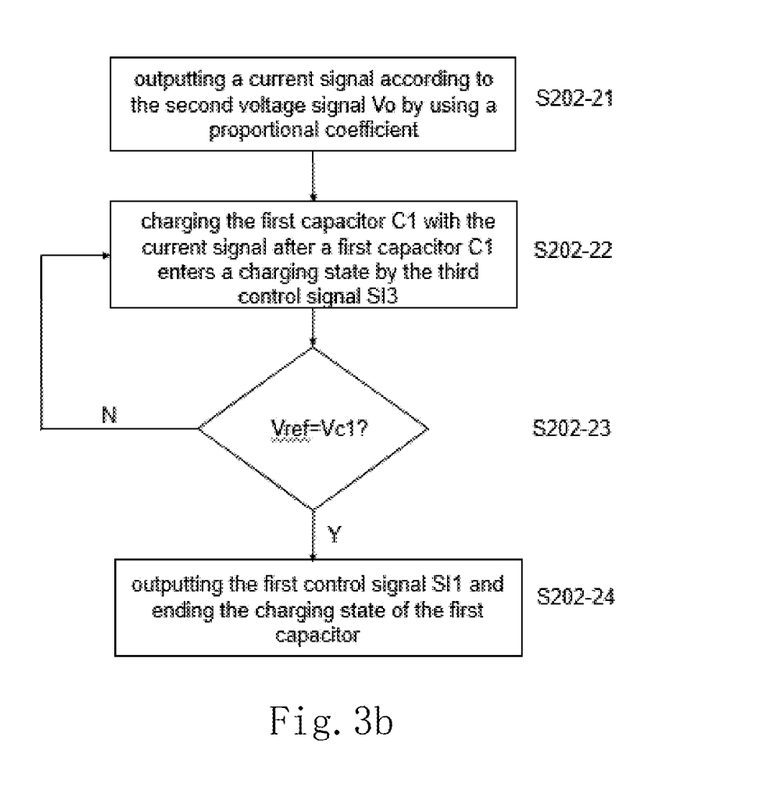

Referring to FIGS. 1-3b, FIG. 1 is an explanatory diagram showing a circuit schematic of a flyback converter according to a first embodiment of the present disclosure; FIG. 2 is a flow chart showing a method for controlling the flyback converter; FIG. 3a is a flow chart showing steps of the method in FIG. 2; and FIG. 3b is a flow chart showing steps of the method in FIG. 3a.

As shown in FIG. 1, the flyback converter includes a main switch S1, a transformer T, and an auxiliary switch S2. The transformer T includes a primary winding T1 and a secondary winding T2. The main switch S1 has a first terminal electrically connected to a primary winding T1 of the transformer T, and a second terminal being grounded. The auxiliary switch S2 is a clamp switch in the active clamp flyback converter and is connected to the primary winding T1 of the transformer T in parallel. In one embodiment, an inductor L1 may be an inductor of the primary winding T1.

As shown in FIG. 2, the method for controlling the flyback converter according to the present disclosure includes:

Step 201: obtaining a first voltage signal and a second voltage signal, the first voltage signal representing an input voltage $V_{bus}$ of the flyback converter, and the second voltage signal representing an output voltage $V_o$ of the flyback converter;

Step 202: controlling turn-on of the auxiliary switch S2, wherein the turn-on time period $t_{on}$ of the auxiliary switch S2 is determined according to the first voltage signal and the second voltage signal;

Step 203: turning on the main switch S1 at Zero Voltage Switching (ZVS) condition, wherein the main switch S1 is turned on at the time delayed for a duration of a dead time $t_{delay}$ after turning off of the auxiliary switch S2.

Figure 10:
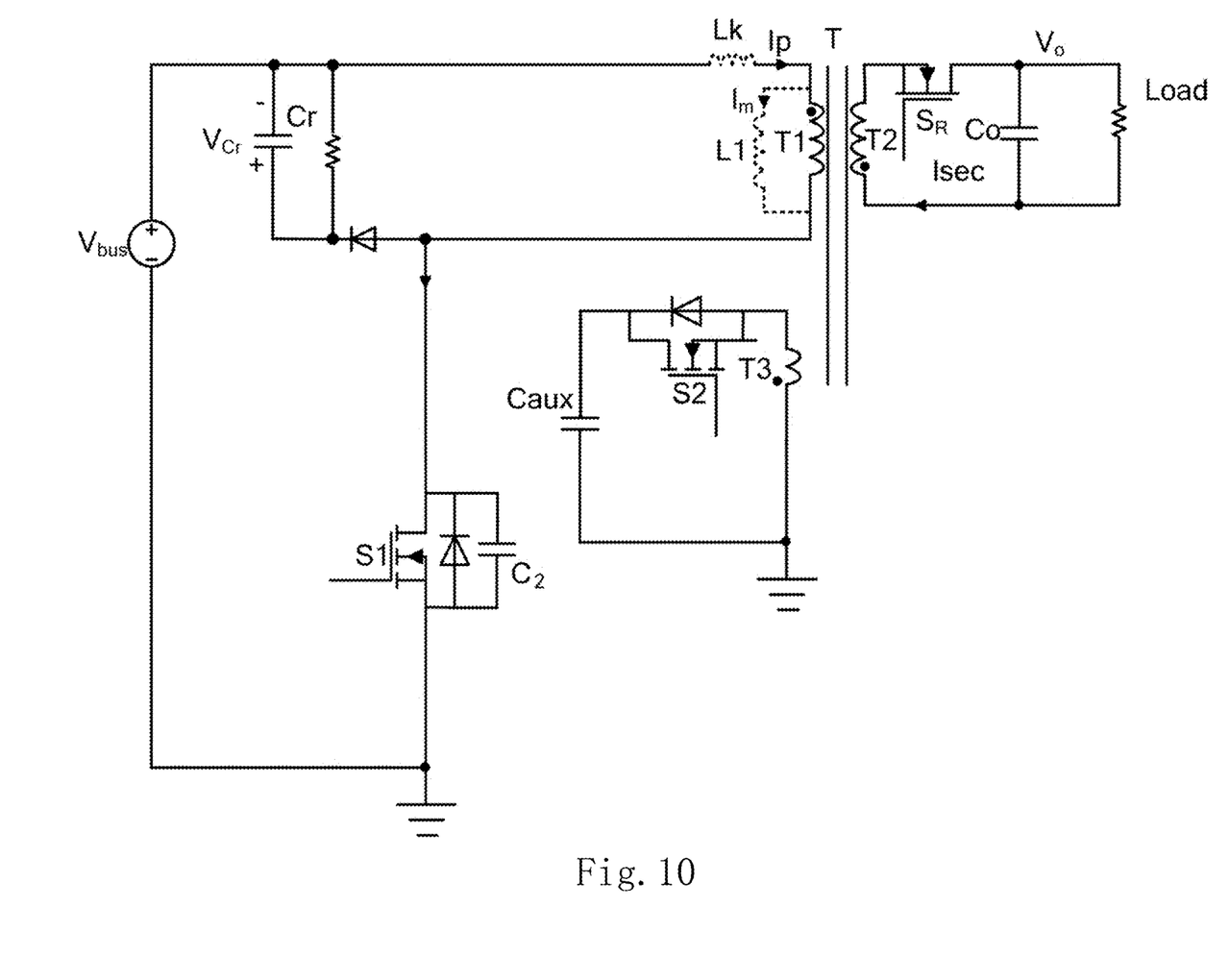
FIG. 10 is an explanatory diagram showing a circuit schematic of a flyback converter according to a second embodiment of the present disclosure.
Figure 11:
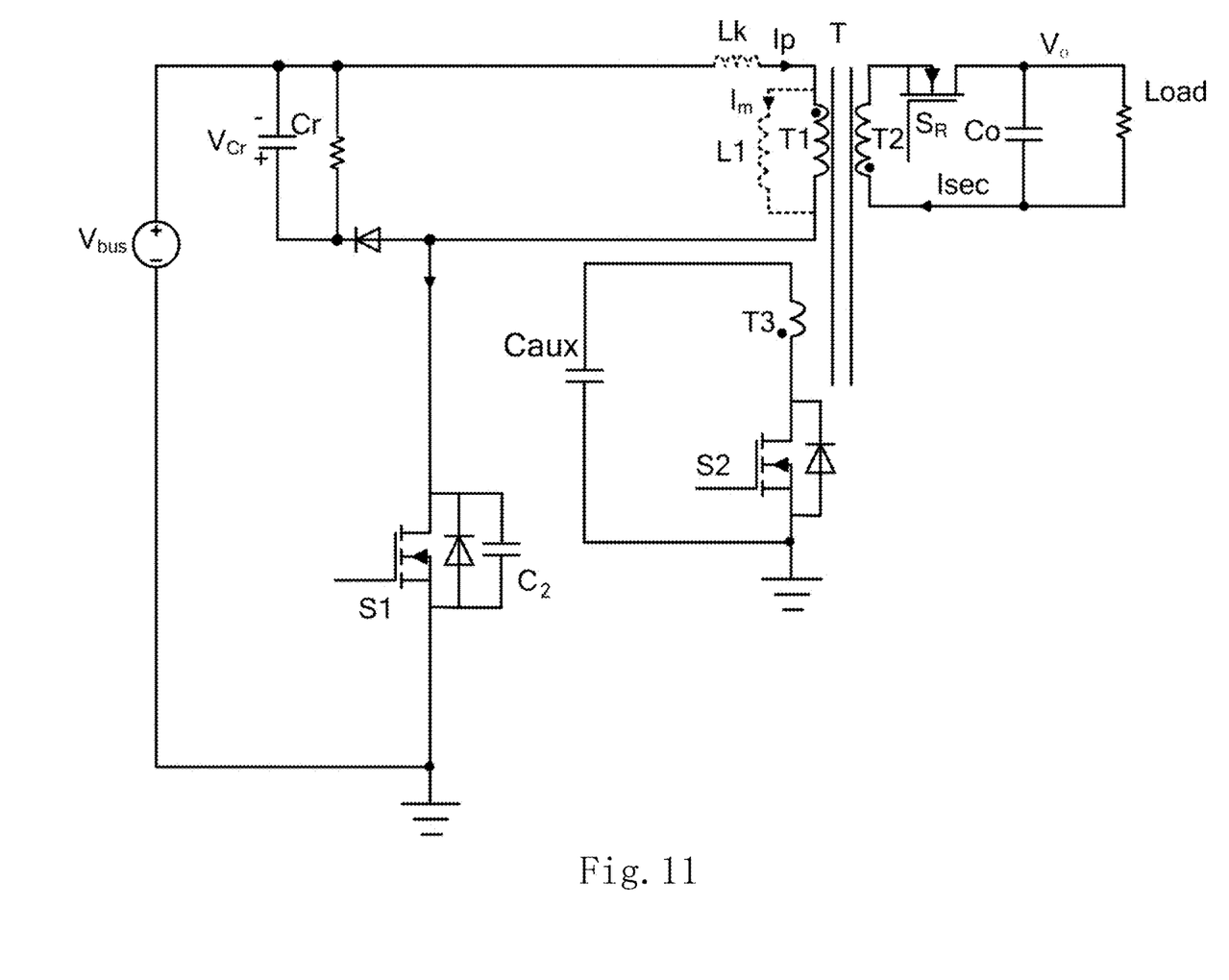
FIG. 11 is an explanatory diagram showing a circuit schematic of a flyback converter according to a third embodiment of the present disclosure.

In this embodiment, the first voltage signal and the second voltage signal are obtained directly by sampling voltages at an input terminal and an output terminal of the flyback converter respectively in Step 201, but the present invention is not limited thereto. In other embodiments, the first voltage signal and the second voltage signal may be obtained indirectly. For example, as shown in FIGS. 10-11, the first voltage signal may be obtained by sampling a negative voltage at an auxiliary winding T3 of the transformer T, and the second voltage signal may be obtained by sampling a positive voltage at the auxiliary winding T3 in Step 201. In still another embodiment, the synchronous rectifier switch SR may act as the auxiliary switch of the flyback converter and the first voltage signal may be obtained by sampling the voltage across the synchronous rectifier switch under off-state condition. Specific methods for obtaining the first voltage signal and the second voltage signal are not limited in the present invention and may be designed by those skilled in the art as necessary.

Further, as shown in FIG. 3a, step 202 may further include:

Step 202-1: generating a third control signal and turning on the auxiliary switch according to the third control signal;

Step 202-2: generating a first control signal according to the first voltage signal, the second voltage signal, and the third control signal; and Step 202-3: turning off the auxiliary switch according to the first control signal.

In one embodiment, step 202 further includes: outputting a first drive signal $S_{sw}$ according to the third control signal SI3 and the first control signal SI1. The first drive signal $S_{sw}$ with a first level (for example but not limited to a high level) or a first edge (for example but not limited to a rising edge) is generated according to the third control signal SI3, so as to turn on the auxiliary switch S2. The first drive signal $S_{sw}$ with a second level (for example but not limited to a low level) or a second edge (for example but not limited to a falling edge) is generated according to the first control signal SI1, so as to turn off the auxiliary switch S2.

Further, as shown in FIG. 3b, Step 202-2 may further include:

Step 202-21: outputting a current signal according to the second voltage signal $V_o$ by using a proportional coefficient;

Step 202-22: charging the first capacitor C1 with the current signal after a first capacitor C1 enters a charging state by the third control signal SI3;

Step 202-23: comparing a reference voltage $V_{ref}$ with a voltage at the first capacitor C1, wherein the reference voltage $V_{ref}$ is a voltage corresponding to a voltage of the first voltage signal $V_{bus}$. For example, the reference voltage may be a sampling voltage of the first voltage signal $V_{bus}$;

Step 202-24: outputting the first control signal SI1 and ending the charging state of the first capacitor when the voltage at the first capacitor C1 is the same as the reference voltage $V_{ref}$, wherein the turn-on time $t_{on}$ is a charging time of the first capacitor.

Refer to FIG. 2, Further, in Step 203, the second control signal SI2 for turning on the main switch S1 is generated at a time delayed for a duration of the dead time $t_{delay}$ after the generation of the first control signal SI1.

Further, in Step 202-2, the proportional coefficient may be obtained according to the following formula:

$$\frac{C}{K} = \frac{\sqrt{L_m C_{eq}}}{n}. \qquad \text{(Equation 1)}$$

Here, C indicates a capacitance value of the first capacitor C1; K indicates the proportional coefficient; $C_{eq}$ indicates a capacitance value of a parasitic capacitance C2 between the first terminal of the main switch S1 and ground; $L_m$ indicates an inductance value of the inductor L1 of the primary switch; n indicates a turn ratio of the transformer T.

In Step 202, the turn-on time $t_{on}$ may be determined according to the following formula:

$$t_{on} = \frac{V_{bus}}{nV_o}\sqrt{L_m C_{eq}}. \qquad \text{(Equation 2)}$$

Here, $t_{on}$ indicates the turn-on time of the auxiliary switch, $V_{bus}$ indicates the voltage of the first voltage signal; $V_o$ indicates the voltage of the second voltage signal; $C_{eq}$ indicates the capacitance value of the parasitic capacitance C2 between the first terminal of the main switch S1 and the ground; $L_m$ indicates the inductance value of the inductor L1; n indicates the turn ratio of the transformer T.

In one embodiment, in Step 203, the dead time $t_{delay}$ may be obtained according to the following formula:

$$t_{delay} \geq \frac{\pi\sqrt{L_m C_{eq}}}{2} \qquad \text{(Equation 3)}$$

Here, $t_{delay}$ indicates the dead time between the turning off of the auxiliary switch S2 and the turning on of the main switch S1, $C_{eq}$ indicates the capacitance value of the parasitic capacitance C2 between the first terminal of the main switch S1 and ground; and Lm indicates the inductance value of the inductor L1.

In another embodiment, the second control signal SI2 is generated when the voltage across the main switch S1 is a substantially zero voltage. Thereby the dead time $t_{delay}$ is determined by detecting the zero-crossing point of the voltage across the main switch S1.

Figure 4:
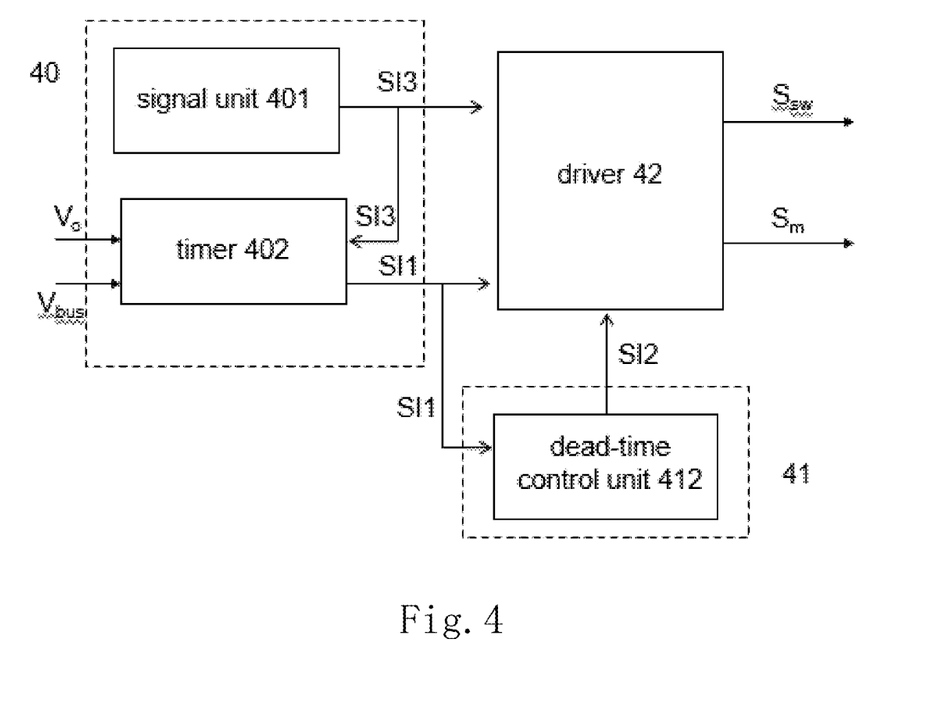
FIG. 4 is an explanatory diagram showing a schematic of a control device in the flyback converter according to the present disclosure.
Figure 5:
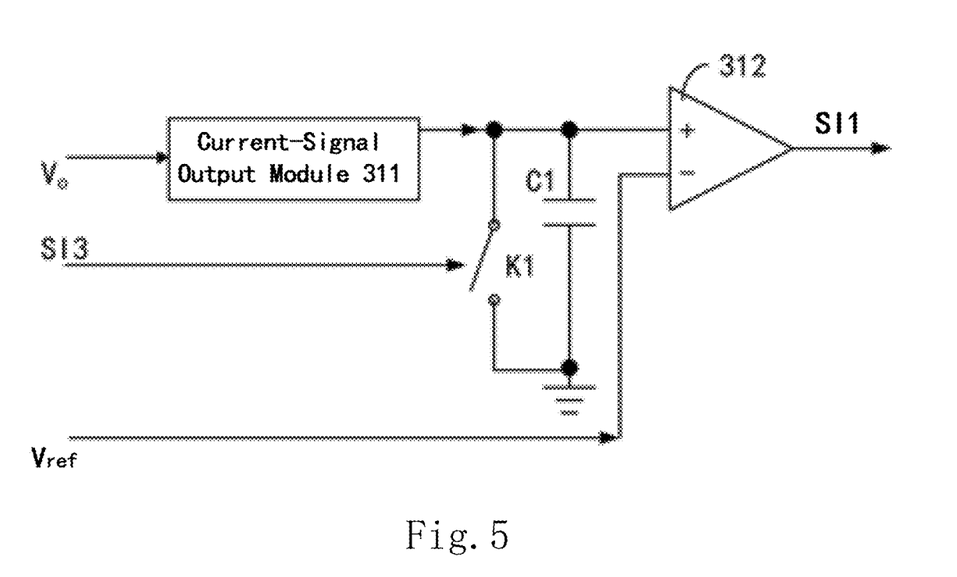
FIG. 5 is an explanatory diagram showing a schematic of a timer in FIG. 4.
Figure 6:
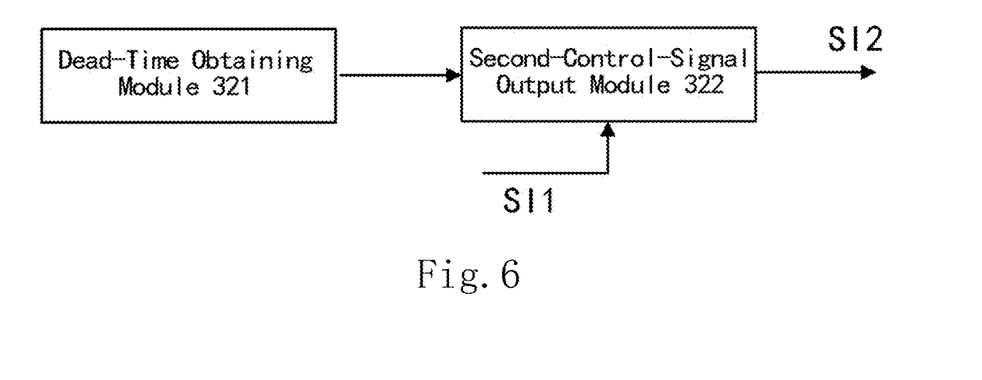
FIG. 6 is an explanatory diagram showing a schematic of a dead-time control unit in FIG. 4.

Now referring to FIG. 1 and FIGS. 4-6, FIG. 4 is an explanatory diagram showing a schematic of a control device in the flyback converter according to the present disclosure; FIG. 5 is an explanatory diagram showing a schematic of a timer in FIG. 4; and FIG. 6 is an explanatory diagram showing a schematic of a dead-time control unit in FIG. 4.

As shown in FIG. 4, the control device in the flyback converter according to the present disclosure includes a first operation means 40 and a second operation means 41.

The first operation means 40 for controlling turn-on of the auxiliary switch S2, wherein a turn-on time period $t_{on}$ of the auxiliary switch S2 is determined according to the first voltage signal and the second voltage signal. In one embodiment, the first voltage signal represents a signal according to an input voltage of the flyback converter, and the second voltage signal represents a signal according to an output voltage of the flyback converter.

The second operation means 41 for turning on the main switch S1 at ZVS condition, wherein the main switch S1 is turned on at the time delayed for a duration of a dead time $t_{delay}$ after turning off of the auxiliary switch S2.

As shown in FIG. 4, the first operation means includes a signal unit 401 and a timer 402.

The signal unit 401 is configured to generate the third control signal SI3, wherein the third control signal SI3 is used for turning on the auxiliary switch S2. The signal unit 401 can be, but not be limited to, configured to generate the third control signal SI3 at the time when the magnetizing current of the flyback converter returns to zero.

The timer 402 receives the first voltage signal, the second voltage signal, and the third control signal SI3, and outputs a first control signal SI1 to the controller 41, wherein the first control signal SI1 is used for turning off the auxiliary switch.

Refer to FIG. 4 again, the second operation means 41 includes a dead-time control unit 412. The dead-time control unit 412 receives the first control signal SI1 and outputs a second control signal SI2 according to the first control signal SI1 and the dead time $t_{delay}$ so as to turn on the main switch S1 at ZVS condition.

In some embodiment, the control device can further include a driver 42. The controller 42 is configured to receive the third control signal SI3 and the first control signal SI1 and to output the first drive signal $S_{SW}$. The first drive signal $S_{SW}$ with a first level or a first edge is generated by the third control signal SI3 to turn on the auxiliary switch S2. And the first drive signal $S_{SW}$ with a second level or a second edge is generated by the first control signal SI1 to turn off the auxiliary switch S2.

In this embodiment, the controller 41 may also output a second drive signal Sm according to second control signal SI2, so as to turn on the main switch S1.

In some embodiment, the driver can be for example but not limited to an RS flip-flop.

In one embodiment, there is also a sampling means (not shown) configured to output a third control signal SI3. The sampling means for obtaining a first voltage signal and a second voltage signal, the first voltage signal representing an input voltage of the flyback converter, and the second voltage signal representing an output voltage of the flyback converter.

In one embodiment, the sampling means can directly obtain the first voltage signal and the second voltage signal by sampling the voltage at the input terminal and output terminal of the flyback converter respectively. In another embodiment, the sampling means can indirectly obtain the first voltage signal and the second voltage signal by sampling a negative voltage at an auxiliary winding T3 of the transformer T and a positive voltage at the auxiliary winding T3 respectively. In still another embodiment, the synchronous rectifier switch SR may act as the auxiliary switch of the flyback converter and the sampling means can directly obtain the first voltage signal by sampling the voltage across the synchronous rectifier switch under off-state condition.

Further, as shown in FIG. 5, the timer 402 includes a current-signal output module 311, a first capacitor C1, a first control switch K1, and a comparison module 312. The first capacitor C1 has a first terminal electrically connected to the current-signal output module 311, and a second terminal being grounded. The first control switch K1 is connected to the first capacitor C1 in parallel and may be turned off depending on the third control signal SI3. The comparison module 312 has a first input terminal electrically connected to the first terminal of the first capacitor C1 and the current-signal output module 311, and a second input terminal for receiving the reference voltage $V_{ref}$, wherein the reference voltage $V_{ref}$ is a voltage corresponding to a voltage of the first voltage signal $V_{bus}$. For example, the reference voltage may be a sampling voltage of the first voltage signal $V_{bus}$.

The current-signal output module 311 outputs a current signal according to the second voltage signal (e.g., Vo in FIG. 5) by using a proportional coefficient. When the first control switch K1 is turned off according to the third control signal SI3, the first capacitor C1 enters a charging state in which the first capacitor C1 is charged with the current signal.

The comparison module 312 compares the reference voltage $V_{ref}$ with the voltage at the first capacitor C1. When the voltage at the first capacitor C1 is the same as the reference voltage $V_{ref}$, the comparison module 312 outputs the first control signal SI1, so as to turn off the auxiliary switch S2. And then the first capacitor ends the charging state. The turn-on time $t_{on}$ is the charging time of the first capacitor.

In this embodiment, the proportional coefficient used by the current-signal output module 311 may be obtained according to the above-mentioned Equation 1.

Further, in this embodiment, the turn-on time $t_{on}$ may be obtained according to the above-mentioned Equation 2.

FIG. 6 is an explanatory diagram showing a schematic of a dead-time control unit in FIG. 4. As shown in FIG. 6, the dead-time control unit 412 includes a dead-time obtaining module 321 and a second-control-signal output module 322. The dead-time obtaining module 321 obtains the dead time $t_{delay}$. The second-control-signal output module 322 is electrically connected to the dead-time obtaining module 321. The second control signal SI2 is generated at a time delayed for a duration of the dead time $t_{delay}$ after the generation of the first control signal SI1 so that the main switch S1 is turned on. In this embodiment, the dead-time obtaining module 321 is a time delayer, but the present invention is not limited thereto.

In this embodiment, the dead time $t_{delay}$ may be obtained according to the above-mentioned Equation 3, or the dead time $t_{delay}$ may be determined by detecting the zero-crossing point of the voltage across the main switch S1.

Figure 7:
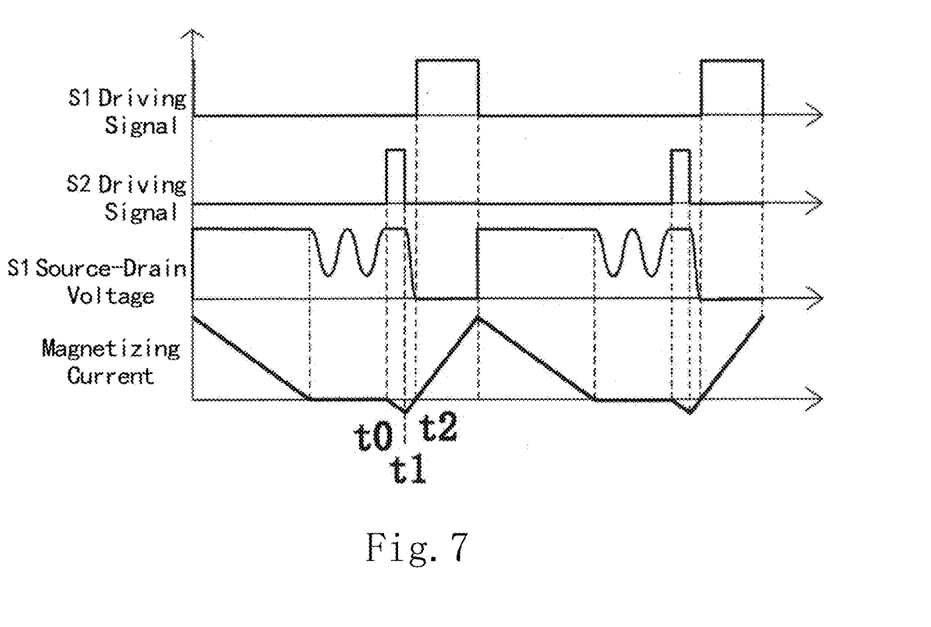
FIG. 7 is a waveform diagram of the flyback converter according to the present disclosure.
Figure 8:
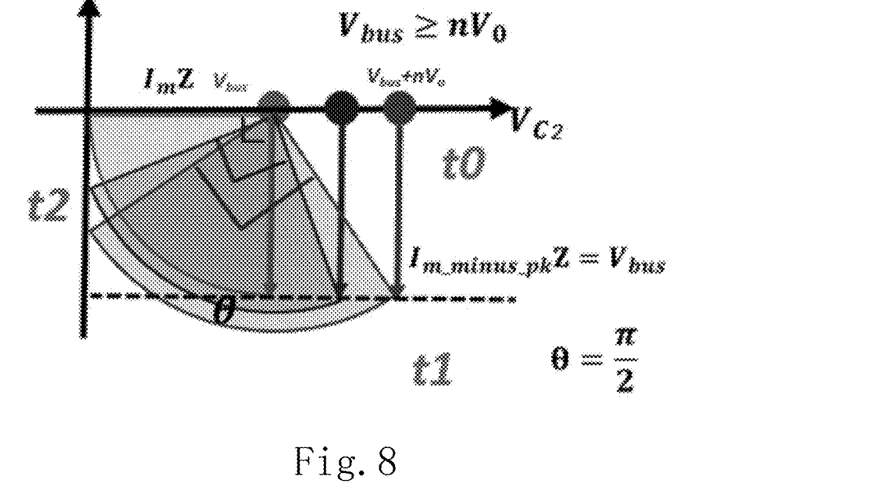
FIGS. 8-9 are ZVS resonant state planes of the flyback converter under different load conditions by using the control method according to the present disclosure.
Figure 9:
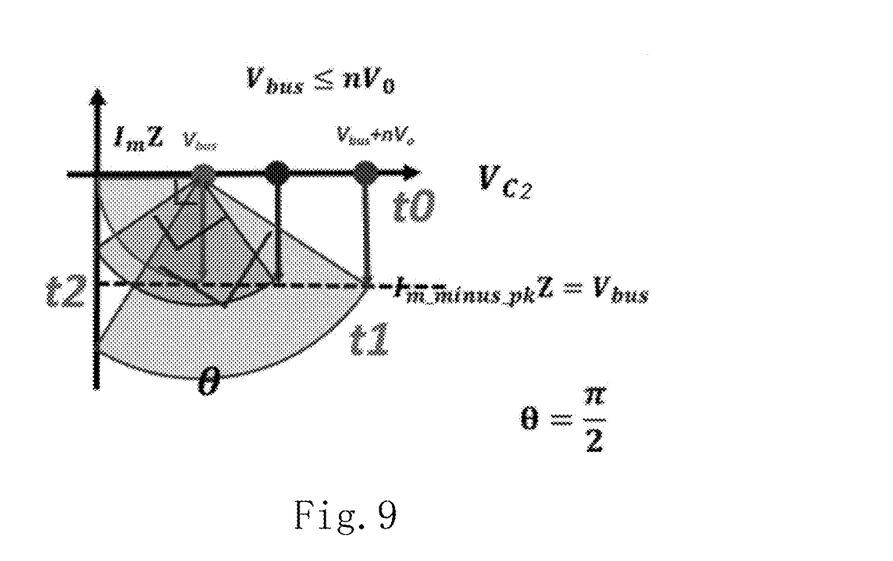

FIG. 7 is a waveform diagram of the flyback converter according to the present disclosure. FIGS. 8-9 are ZVS resonant state planes of the flyback converter under different load conditions by using the control method according to the present disclosure. Below, principles of a method and an apparatus for controlling the auxiliary switch of the flyback converter in the present disclosure will be described in detail with reference to FIG. 1 and FIGS. 7-9.

In order to achieve the ZVS of the main switch S1 in the flyback converter, it is necessary that the auxiliary switch S2 has been turned on for a duration of time before the main switch S1 is turned on, so as to generate a negative magnetizing current. In order to allow a source-drain voltage $V_{DS}$ of the main switch S1 down to almost zero with the amplitude of the generated magnetizing current, it is required that the minimum turn-on time $t_{on}$ of the auxiliary switch S2 and the corresponding minimum dead time $t_{delay}$ satisfy the following formula, respectively:

$$t_{on} = \sqrt{L_m C_{eq}} \times \sqrt{\frac{V_{bus}^2 - (nV_o)^2}{(nV_o)^2}}, \quad \text{(Equation 4)}$$

$$t_{delay} = \theta \times \sqrt{L_m C_{eq}}. \quad \text{(Equation 5)}$$

Here, $\theta$ is a phase angle, and may satisfy the following formulas:

$$\theta = \pi - \cos^{-1}\frac{nV_o}{V_{bus}}, \text{ when } Vbus > nVo; \text{ and}$$

$$\theta = \pi - \cos^{-1}\frac{V_{bus}}{nV_o}, \text{ when } Vbus \leq nVo.$$

From the above formulas, it may be understood that, in the prior art, the turn-on time of the auxiliary switch and the corresponding dead time need to be adjusted according to the input voltage and the output voltage. The control is complicated and is especially not suitable for the high-frequency design.

In contrast, the turn-on time $t_{on}$ of the auxiliary switch S2 in the present disclosure may be obtained according to the above-mentioned Equation 2. Referring to Equation 2, although the turn-on time $t_{on}$ of the auxiliary switch S2 is still relevant to the input voltage and the output voltage, the relationship between them becomes a simple proportional relation. Therefore, the turn-on time $t_{on}$ of the auxiliary switch S2 may be easily regulated according to the circuit parameters of the flyback circuit.

As shown in FIG. 7, t0-t1 is the duration of the turn-on time $t_{on}$ of the auxiliary switch S2, while t1-t2 is the duration of the dead time $t_{delay}$. According to the method and the apparatus for controlling an auxiliary switch in the present disclosure, at time t0, the auxiliary switch S2 is turned on, such that a voltage $nV_o$ is applied to the inductor L1 in the transformer T so as to generate the magnetizing current $I_m$. Then, at time t1, the auxiliary switch S2 is turned off, such that the inductor L1 and the parasitic capacitance C2 resonate. As a result, the source-drain voltage $V_{DS}$ of the main switch S1 starts to decrease. With the aid of the magnetizing current Im, the voltage $V_{DS}$ is decreased to almost zero at time t2. At time t2, the main switch S1 is turned on. In this way, ZVS may be achieved.

FIGS. 8-9 are resonant state planes of the flyback converter when $V_{bus}$ is greater than $n*V_o$, and when $V_{bus}$ is less than or equal to $n*V_o$, respectively. Here, the horizontal axis indicates a voltage $V_{Ceq}$ of the parasitic capacitance C2, which is equivalent to the source-drain voltage $V_{DS}$ of the main switch S1. The vertical axis indicates a product of the magnetizing current $I_m$ and a characteristic impedance Z.

Referring to FIG. 7 and FIGS. 8-9, at time t0, the auxiliary switch S2 is turned on. The voltage at C2 is Vbus+nV$_o$. The magnetizing current $I_m$ starts to negatively increase from 0. Then, at time t1, the product of the magnetizing current $I_m$ and the characteristic impedance Z reaches Vbus. The auxiliary switch S2 is turned off. Then, starting from time t1, the inductor L1 and the parasitic capacitance Ceq start to resonate. Then, at time t2, the voltage at C2 becomes equivalent to the source-drain voltage $V_{DS}$. At this time, $V_{DS}$ is 0.

As can be seen from the state locus diagram from t1 to t2, there is an arched trace with a radian of $\pi/2$. Further, a resonant period of the inductor L1 and the parasitic capacitance C2 may be expressed as $2\pi\sqrt{L_m C_{eq}}$, which corresponds to a circle in the state locus. Consequently, since the duration from t1 to t2 (i.e., the dead time) is a quarter of the resonant cycle, the above-mentioned Equation 3 may be deduced.

Referring to FIGS. 8 and 9 again, there are three dots on the horizontal axis which represent a light load, a moderate load, and a heavy load, respectively, along a direction of the horizontal axis. As can be seen, in any case of the above three loads, it is ensured that the duration from t1 to t2 (i.e., the dead time) is a quarter of the resonant cycle. In order to achieve ZVS, the dead time should be no smaller than the duration from t1 to t2. The dead time may be expressed by the above-mentioned Equation 3.

The previous embodiment is described by taking an active clamp flyback converter shown in FIG. 1 as an example, in which the auxiliary switch is a clamp switch in the active clamp flyback converter. However, the present invention is not limited thereto. The control method and apparatus according to the present disclosure may be alternatively applied to flyback converters of other schematics. For example, as shown in FIGS. 10 and 11, the flyback converter may further include an auxiliary winding T3, an auxiliary switch S2, and an auxiliary capacitance Caux. The auxiliary switch S2, the auxiliary capacitance Caux and the auxiliary winding T3 are connected in series. In this embodiment, the principles and operations of the control method and control apparatus of the flyback converter are the same as those in the previous embodiments. Accordingly, the detailed description is omitted. In other application, the auxiliary switch may be a synchronous rectifier switch SR. Principles and operations of the control method and the control apparatus of the flyback converter are almost the same as those in the previous embodiments, except that the first voltage signal may be obtained by sampling a voltage at the synchronous rectifier switch SR.

The present invention may provide a constant dead time in the flyback converter by setting the turn-on time of the auxiliary switch. Additionally, the present invention may implement zero-voltage-switching (ZVS) of the main switch within a full range of loads at different output voltages with respect to a full range of input voltage (e.g., 90~264Vac), and may implement optimized designs efficiently.

Note that the above embodiments are only used to illustrate the present disclosure but not to limit the technical solution described in the present disclosure. Moreover, although the present disclosure is described in detail with reference to the above embodiments in this specification, the ordinary persons skilled in the art should understand that modifications or equivalent substitutions may also be made to the present disclosure. Therefore, all the technical solutions not departing from the spirit and scope of the present application and the improvements thereof should be covered by the protection scope of the appended claims in the present application.

What is claimed is:

1. A method for controlling a flyback converter, the flyback converter including a main switch, a transformer, and an auxiliary switch, the method comprising:
    obtaining a first voltage signal and a second voltage signal, wherein the first voltage signal relates to an input voltage of the flyback converter, and the second voltage signal relates to an output voltage of the flyback converter;
    controlling turn-on of the auxiliary switch, wherein a turn-on time period of the auxiliary switch is determined according to the first voltage signal and the second voltage signal, wherein the turn-on time period of the auxiliary switch increases when a voltage of the first voltage signal is increasing and wherein the turn-on time period of the auxiliary switch increases when a voltage of the second voltage signal is decreasing; and
    turning on the main switch at zero voltage switching condition, wherein the main switch is turned on at a time delayed for a duration of a dead time after turning off of the auxiliary switch, wherein the dead time is constant.

2. The control method according to claim 1, wherein a turn-on time period of the auxiliary switch is determined according to the following formula:

$$t_{on} = \frac{V_{bus}}{nV_o}\sqrt{L_m C_{eq}}$$

wherein $t_{on}$ indicates the turn-on time period of the auxiliary switch, $V_{bus}$ indicates the voltage of the first voltage signal; $V_o$ indicates the voltage of the second voltage signal; $C_{eq}$ indicates a capacitance value of a parasitic capacitance between a first terminal of the main switch and ground; $L_m$ indicates an inductance value of an inductor of a primary winding of the transformer; n indicates a turn ratio of the transformer.

3. The control method according to claim 1, wherein the auxiliary switch is an active clamp switch for the flyback converter.

4. The control method according to claim 1, wherein the transformer further comprises an auxiliary winding, and the auxiliary switch is connected to the auxiliary winding in series.

5. The control method according to claim 1, wherein the auxiliary switch is a synchronous rectifier switch of the flyback converter.

6. The control method according to claim 4, wherein the first voltage signal is obtained by sampling a negative voltage at the auxiliary winding, and the second voltage signal is obtained by sampling a positive voltage at the auxiliary winding.

7. The control method according to claim 5, wherein the first voltage signal is obtained by sampling a voltage across the synchronous rectifier switch under off-state condition.

8. The control method according to claim 1, controlling turn-on of the auxiliary switch further comprising:
    outputting a current signal according to the second voltage signal by using a proportional coefficient; and
    charging a first capacitor with the current signal until a voltage across the first capacitor is equal to a reference voltage, wherein the reference voltage is a voltage corresponding to the first voltage signal;
    wherein the turn-on time period of the auxiliary switch is a charging time of the first capacitor.

9. The control method according to claim 1, wherein the dead time is determined according to the following formula:

$$t_{delay} \geq \frac{\pi\sqrt{L_m C_{eq}}}{2}$$

wherein $t_{delay}$ indicates the dead time, $C_{eq}$ indicates a capacitance value of the parasitic capacitance between the first terminal of the main switch and ground; and $L_m$ indicates the inductance value of the inductor of a primary winding of the transformer.

10. The control method according to claim 1, wherein the dead time is determined by detecting the zero-crossing point of the voltage across the main switch.

11. The control method according to claim 1, wherein controlling turn-on of the auxiliary switch further comprises:
    generating a third control signal and turning on the auxiliary switch according to the third control signal;
    generating a first control signal according to the first voltage signal, the second voltage signal, and the third control signal; and
    turning off the auxiliary switch according to the first control signal.

12. The control method according to claim 11, wherein turning on the main switch further comprises:
    outputting a second control signal according to the first control signal and the dead time and turning on the main switch at a zero-voltage switching condition according to the second control signal.

13. The control method according to claim 11, wherein generating the first control signal according to the first voltage signal, the second voltage signal and the third control signal further comprises:
    outputting a current signal according to the second voltage signal by using a proportional coefficient;

charging a first capacitor with the current signal after the first capacitor enters a charging state by the third control signal;
comparing a reference voltage with a voltage at the first capacitor; and
outputting the first control signal and ending the charging state of the first capacitor when the voltage at the first capacitor is the same as the reference voltage, wherein the reference voltage is a voltage corresponding to the first voltage signal.

14. The control method according to claim 13, wherein the main switch has a first terminal electrically connected to a primary winding of the transformer, and a second terminal being grounded, and
the proportional coefficient is obtained according to the following formula:

$$\frac{C}{K} = \frac{\sqrt{L_m C_{eq}}}{n}$$

wherein C indicates a capacitance value of the first capacitor; K indicates the proportional coefficient; $C_{eq}$ indicates a capacitance value of the parasitic capacitance between the first terminal of the main switch and ground; $L_m$ indicates the inductance value of the inductor of the primary winding; n indicates the turn ratio of the transformer.

15. The control method according to claim 11, wherein controlling turn-on of the auxiliary switch further comprises:
outputting a first drive signal with a first level or a first edge according to the third control signal and turning on the auxiliary switch according to the first drive signal with the first level or a first edge; and
outputting the first drive signal with a second level or a second edge according to the first control signal and turning off the auxiliary switch according to the first drive signal with the second level or a second edge.

16. An apparatus for controlling a flyback converter, the flyback converter including a main switch, a transformer, and an auxiliary switch, the apparatus comprising:
a first operation means for controlling turn-on of the auxiliary switch, wherein a turn-on time period of the auxiliary switch is determined according to a first voltage signal and a second voltage signal, the first voltage signal representing an input voltage of the flyback converter, and the second voltage signal representing an output voltage of the flyback converter, wherein the turn-on time period of the auxiliary switch increases when a voltage of the first voltage signal is increasing and wherein the turn-on time period of the auxiliary switch increases when a voltage of the second voltage signal is decreasing; and
a second operation means for turning on the main switch at zero voltage switching condition, wherein the main switch is turned on at a time delayed for a duration of a dead time after turning off of the auxiliary switch, wherein the dead time is constant.

17. The apparatus according to claim 16, wherein the turn-on time period of the auxiliary switch is determined according to the following formula:

$$t_{on} = \frac{V_{bus}}{nV_o}\sqrt{L_m C_{eq}}$$

wherein $t_{on}$ indicates the turn-on time period of the auxiliary switch, $V_{bus}$ indicates the voltage of the first voltage signal; $V_o$ indicates the voltage of the second voltage signal; $C_{eq}$ indicates a capacitance value of a parasitic capacitance between a first terminal of the main switch and ground; $L_m$ indicates an inductance value of an inductor of a primary winding of the transformer; n indicates a turn ratio of the transformer.

18. The apparatus according to claim 16, wherein the auxiliary switch is an active clamp switch in the flyback converter.

19. The apparatus according to claim 16, wherein the transformer further comprises an auxiliary winding, and the auxiliary switch is connected to the auxiliary winding in series.

20. The apparatus according to claim 16, wherein the auxiliary switch is a synchronous rectifier switch of the flyback converter.

21. The apparatus according to claim 16, wherein the first operation means obtains the first voltage signal and the second voltage signal by sampling voltages at an input terminal and an output terminal of the flyback converter respectively.

22. The apparatus according to claim 19, wherein the first operation means obtains the first voltage signal by sampling a negative voltage at the auxiliary winding, and obtains the second voltage signal by sampling a positive voltage at the auxiliary winding.

23. The apparatus according to claim 20, wherein the sampling means obtains the first voltage signal by sampling a voltage across the synchronous rectifier switch under off-state condition.

24. The apparatus according to claim 16, wherein the dead time is determined according to the following formula:

$$t_{delay} \geq \frac{\pi\sqrt{L_m C_{eq}}}{2}$$

wherein $t_{delay}$ indicates the dead time, $C_{eq}$ indicates a capacitance value of the parasitic capacitance between the first terminal of the main switch and ground; and $L_m$ indicates an inductance value of the inductor of the primary winding.

25. The apparatus according to claim 16, wherein the dead time is determined by detecting the zero-crossing point of the voltage across the main switch.

26. The apparatus according to claim 16, wherein the first operation means comprises:
a signal unit configured to generate a third control signal, wherein the third control signal is used for turning on the auxiliary switch; and
a timer configured to receive a first voltage signal, a second voltage signal, and the third control signal, and to output a first control signal to the controller, wherein the first control signal is used for turning off the auxiliary switch.

27. The apparatus according to claim 26, wherein the timer comprises:
a current-signal output module configured to output a current signal according to the second voltage signal by using a proportional coefficient;
a first capacitor having a first terminal electrically connected to the current-signal output module, and a second terminal being grounded;

a first control switch electrically connected to the first capacitor in parallel and configured to control the first capacitor to enter a charging state by the third control signal; and a comparison module having a first input terminal electrically connected to the first terminal of the first capacitor, and a second input terminal for receiving a reference voltage corresponding to the first voltage signal, the comparison module being configured to compare the reference voltage with a voltage at the first capacitor;

wherein the comparison module is configured to output the first control signal and the first capacitor ends the charging state when the voltage at the first capacitor is the same as the reference voltage; and wherein the turn-on time period is a charging time of the first capacitor.

28. The apparatus according to claim 27, wherein the main switch has a first terminal electrically connected to a primary winding of the transformer, and a second terminal being grounded, and the proportional coefficient is obtained according to the following formula:

$$\frac{C}{K} = \frac{\sqrt{L_m C_{eq}}}{n}$$

wherein C indicates a capacitance value of the first capacitor; K indicates the proportional coefficient; $C_{eq}$ indicates the capacitance value of the parasitic capacitance between the first terminal of the main switch and ground; $L_m$ indicates the inductance value of the inductor of the primary winding; n indicates the turn ratio of the transformer.

29. The apparatus according to claim 26, wherein the second operation means comprises:

a dead-time control unit configured to receive the first control signal, and to output a second control signal according to the first control signal and the dead time, wherein the second control signal is used for turning on the main switch at a zero-voltage switching condition.

30. The apparatus according to claim 29, wherein the dead-time control unit comprises:

a dead-time obtaining module configured to obtain the dead time; and a second-control-signal output module electrically connected to the dead-time obtaining module, and configured to receive the first control signal and the dead-time and to output a second control signal.

31. The apparatus according to claim 26, wherein the apparatus further comprises:

a driver configured to receive the third control signal and a first control signal, and to output the first drive signal, wherein the first drive signal with a first level or a first edge is generated by the third control signal to turn on the auxiliary switch and the first drive signal with a second level or a second edge is generated by the first control signal to turn off the auxiliary switch.

* * * * *